(12) United States Patent
McEntire et al.

(10) Patent No.: US 6,512,206 B1
(45) Date of Patent: Jan. 28, 2003

(54) CONTINUOUS PROCESS FURNACE

(75) Inventors: William D. McEntire, Sonora, CA (US); Kevin B. Peck, Sonora, CA (US); Michael D. Soliday, Sonora, CA (US); James Sanches, Sonora, CA (US)

(73) Assignee: MRL Industries, Sonora, CA (US)

( * ) Notice: Subject to any disclaimer, the term of this patent is extended or adjusted under 35 U.S.C. 154(b) by 0 days.

(21) Appl. No.: 10/032,444

(22) Filed: Jan. 2, 2002

(51) Int. Cl.⁷ ............................................. F27D 11/00
(52) U.S. Cl. ..................... 219/388; 219/390; 219/405; 118/724; 118/725; 392/416; 392/418
(58) Field of Search ................................. 219/390, 388, 219/405, 411; 118/724, 725, 50.1; 392/416, 418

(56) References Cited

U.S. PATENT DOCUMENTS

| | | | |
|---|---|---|---|
| 3,785,853 A | * | 1/1974 | Kirkman et al. ............ 117/106 |
| 4,416,623 A | | 11/1983 | Takahashi |
| 4,544,025 A | * | 10/1985 | Aldrich et al. ................ 165/65 |
| 4,568,279 A | | 2/1986 | Logue et al. |
| 4,574,182 A | * | 3/1986 | Pescatore et al. ........... 219/388 |
| 4,596,922 A | | 6/1986 | Erickson |
| 4,911,638 A | | 3/1990 | Bayne et al. |
| 5,038,019 A | | 8/1991 | McEntire et al. |
| 6,291,801 B1 | * | 9/2001 | Guidotti et al. ............. 219/390 |

* cited by examiner

Primary Examiner—Teresa Walberg
Assistant Examiner—Shawntina T. Fuqua
(74) Attorney, Agent, or Firm—Burns, Doane, Swecker & Mathis, LLP

(57) ABSTRACT

The present invention provides a furnace which heat treats substrates. The furnace includes a heating section and working components. The heating section includes heating coils having spacers disposed within the heating coils where a mass of the heating coils and a mass of the spacers contributes to a mass of the heating section. The working components include a processing chamber and a transport mechanism. The processing chambers facilitates passage of a substrate through the heating section. The transport mechanism transports the substrate through the heating section and into the exit assembly. The heating section mass exceeds a combined mass of the processing chamber, the transport mechanism and the substrate within the heating section.

23 Claims, 8 Drawing Sheets

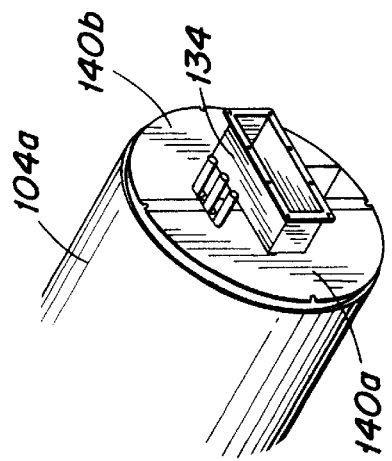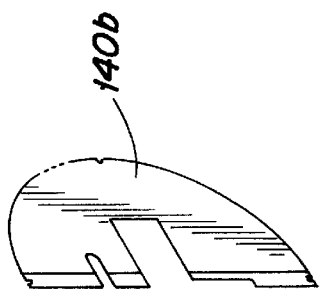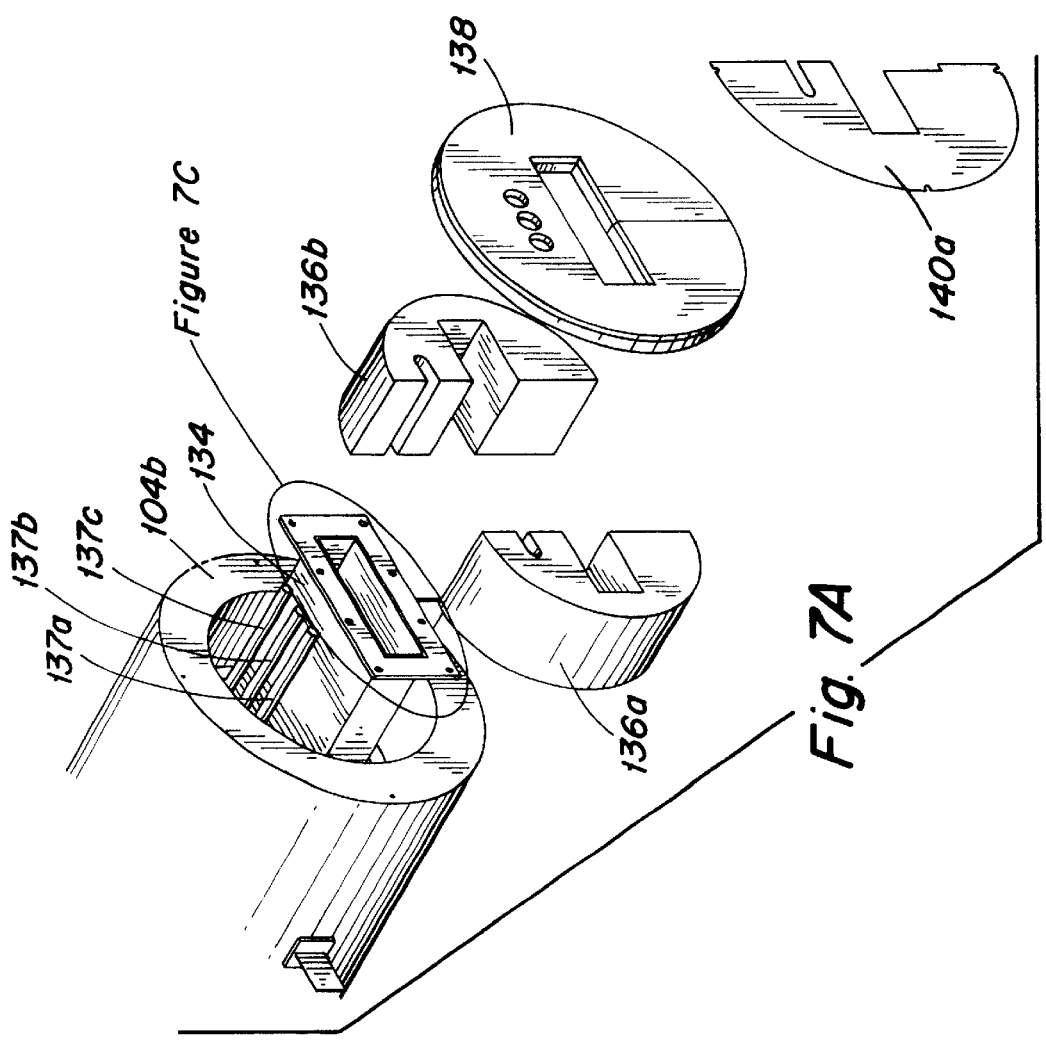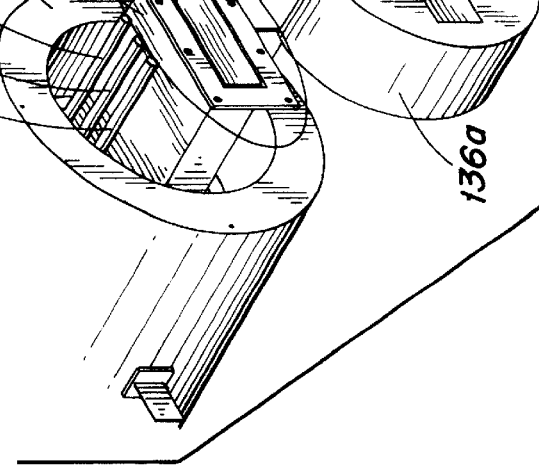

CONTINUOUS PROCESS FURNACE

BACKGROUND OF THE INVENTION

1. Field of the Invention

The present invention relates generally to furnaces. More specifically, the present invention relates to a continuous process furnace having a plurality of heating zones for heat treating a substrate.

2. Description of Related Art

Today, many products are subjected to heat treating operations during production. The product undergoes heat treatment for many reasons, including thermal curing during semiconductor wafer fabrication, annealing operations to harden a material of the product, such as steel, or the like. Often times, the heat treatment process is carried out at very high temperatures. In order to carry out a heat treatment operation at these elevated temperatures, ovens are constructed capable of high operating temperatures.

In some cases, ovens used for heat treating were constructed of brick having a great amount of thermal inertia. These brick ovens typically had a rectangular configuration as shown with reference to FIG. 1 which illustrates a cross-sectional view of a brick oven 10 in accordance with the prior art. The brick oven 10 includes a rectangular cross-section through which products pass during heat treating. During a heat treatment operation, a uniform heating environment is preferred in order to ensure proper heat treating. Nonetheless, due to the rectangular cross section of prior art brick ovens, a uniform heating environment was difficult to achieve. Instead, pockets $A_1$ through $A_4$ and B typically formed within the cross section of the brick oven 10. The pockets $A_1$ through $A_4$ and B were of a different temperature than the rest of the cross section of the brick oven 10. Since the pockets $A_1$ through $A_4$ and B were at a different temperature, independent adjustments were required to maintain the pockets $A_1$ through $A_4$ and B at a uniform temperature with the brick oven 10. Additional zones were also required to maintain the pockets $A_1$ through $A_4$ and B at a uniform temperature. Therefore, additional components required for the individual adjustments along with the additional zones increased operating costs for brick ovens. Likewise, the increased amount of components decreased reliability since the increased amount of components increased the likelihood of failure. Moreover, due to the high amount of thermal inertia of the bricks used in the brick oven, the brick ovens required a great amount of time to come up to operating temperatures. As such, manufacturing costs associated with products using these ovens were increased due to the increased time and energy requirements of the ovens.

In order to address the issues associated with brick ovens, manufacturers started implemented ovens having lighter insulation and lower mass. The ovens using lighter insulation and lower mass included light gauge ovens having the rectangular configuration. Nonetheless, these light gauge ovens suffered the problems associated with brick ovens having a rectangular configuration.

These ovens included cylindrical heating elements having wires disposed therein which provided heat for the heating elements, as described in U.S. Pat. No. 4,596,922, the disclosure of which is herein incorporated by reference in its entirety, the prior art heating element included a cylindrical tube formed of a ceramic insulating material along with a wire disposed within the ceramic insulating material. The lightweight ceramic insulating material included good thermal characteristics while at the same time being deformable such that the wire expanded and contracted during operation without damaging either the wire or the ceramic insulating material.

During operation of the prior art heating element, the wire provided a source of heat for the heating element. As such, products passing through the heating element were subjected to a heat treatment operation, whereby the wire exposed the products to heat. Nonetheless, the configuration of the wire within the heating element minimized the thermal efficiency of the heating element. To further illustrate, prior art wires used in the heating elements had a small diameter, as such, the exposed surface area for heating a product was small. The small surface area of the wire required a high temperature of the wire in order to effectively heat products passing through the heating wires. As such, the higher temperatures necessitated increased amounts of energy supplied to the furnace, thereby increasing the overall costs associated with operating ovens using the prior art heating elements. In addition, the high temperatures required by prior art ovens decreased the reliability and efficiency of both the heating element and the furnace using the heating element. Likewise, reliability of these wires were further reduced since the temperature of the heating wire fluctuated during operation of the oven.

Therefore a need exists for a device which minimizes thermal fluctuations of a furnace during operation of the furnace. Moreover, this device should have increased reliability and minimal operating costs.

BRIEF SUMMARY OF THE INVENTION

The present invention fills the aforementioned needs by providing a furnace with a heating section having a high mass. The mass of the heating section of the furnace is larger than a mass of the working components of the furnace.

In one embodiment of the present invention, a furnace for heat treating a substrate is disclosed. The furnace includes a heating section, a transport mechanism, an entrance assembly and an exit assembly. The heating section heat treats the substrate as the substrate passes through the furnace. The heating section includes heating coils which provide heat to the heating section. The transport mechanism, which is partially disposed within the heating section, transports the substrate through the heating section. The transport mechanism enters the heating section via the entrance assembly and exits the heating section via the exit assembly. The furnace also includes a processing chamber disposed within the heating section. A mass of the heating section exceeds a combined mass of a mass of the processing chamber disposed within the heating section, the transport mechanism and the substrate within the heating section.

In another embodiment of the present invention, a furnace for heat treating a substrate having a mass is disclosed. The furnace includes a heating section and working components. The heating section includes a plurality of heating coils and spacers disposed within the heating coils which heat treats the substrate. A mass of the plurality of coils and a mass of the spacers contributes to a heating section mass. The working components, which has a working component mass, includes a transport mechanism, an entrance assembly and an exit assembly. The transport mechanism, which is disposed within the heating section, transports the substrate through the heating section. A mass of the transport mechanism contributes to the working component mass. The entrance assembly, which is disposed adjacent the heating section, admits the substrate into the heating section via the transport mechanism. The entrance assembly includes a processing chamber which extends through the heating section. A portion of the processing chamber which extends through the heating section has a mass which contributes to the working component mass. The exit assembly, which allows exit of the substrate from the heating section, is disposed adjacent the heating section opposite the entry assembly. The heating section mass exceeds a combined mass of the substrate disposed within the heating section and the working component mass.

In yet another embodiment of the present invention, a furnace for heat treating a substrate is disclosed. The furnace includes an entry curtain section assembly for admitting the substrate into the furnace, an entrance assembly coupled with the entry curtain section assembly and a heating section coupled with the entrance assembly. The furnace also includes a transport mechanism disposed within the heating section, an exit assembly disposed adjacent the heating section opposite the entrance assembly, a cooling zone and an exit curtain section assembly coupled with the cooling zone. The heating section heat treats the substrate as the substrate passes through the furnace. The heating section, which has a mass, includes heating coils that provides heat to the heating section and spacers disposed within the heating coils. The transport mechanism transports the substrate through the heating section during heat treatment. The exit assembly facilitates exit of the substrate from the heating section and into the cooling zone, which is coupled with the exit assembly. The cooling zone includes a reverse flow heat exchanger which cools the substrate as the substrate passes through the cooling zone. The exit curtain section assembly facilitates exit of the substrate from the furnace upon cooling of the substrate. The heating section mass exceeds a combined mass of the transport mechanism, a processing chamber which extends through the heating section and the substrate within the heating section.

As may be appreciated, the present invention provides a furnace having a high mass heating section which exceeds a mass of the working components of the furnace. The high mass of the heating section relative to the working components minimizes thermal fluctuations of the furnace during heat treating operations and increases reliability of the furnace.

BRIEF DESCRIPTION OF THE SEVERAL VIEWS OF THE DRAWING(S)

Many advantages of the present invention will be apparent to those skilled in the art with a reading of this specification in conjunction with the attached drawings, wherein like reference numerals are applied to like elements and wherein:

FIG. 7A is a perspective view of an entrance assembly shown with reference to FIG. 2 in accordance with an embodiment of the present invention.

FIG. 7B is a perspective view of the entrance assembly shown with reference to FIG. 7A in an assembled configuration in accordance with an embodiment of the present invention.

DETAILED DESCRIPTION OF THE INVENTION

A furnace having a high heating section mass for heat treating a substrate is disclosed. As an overview, a furnace in accordance with an embodiment of the present invention includes an entrance assembly, a heating section, a transport mechanism and an exit assembly. The entrance assembly includes a processing chamber which allows passage of the substrate from the entrance assembly through the heating section and out of the exit assembly. As will be discussed in greater detail with respect to the accompanying Figures, a mass of the heating section exceeds a combined mass of the processing chamber disposed within the heating section and the substrate within the heating section.

Figure 1:
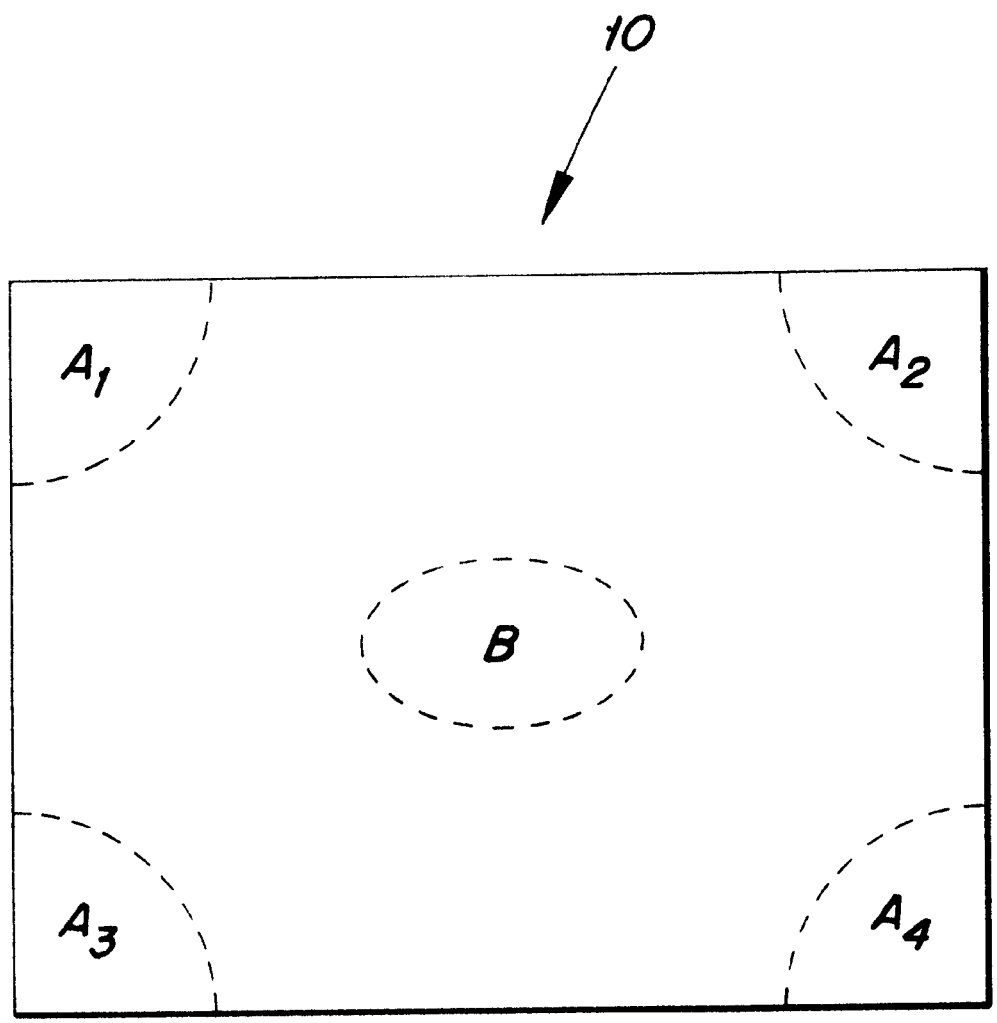
FIG. 1 illustrates a cross-sectional view of a brick oven in accordance with the prior art.
Figure 2:
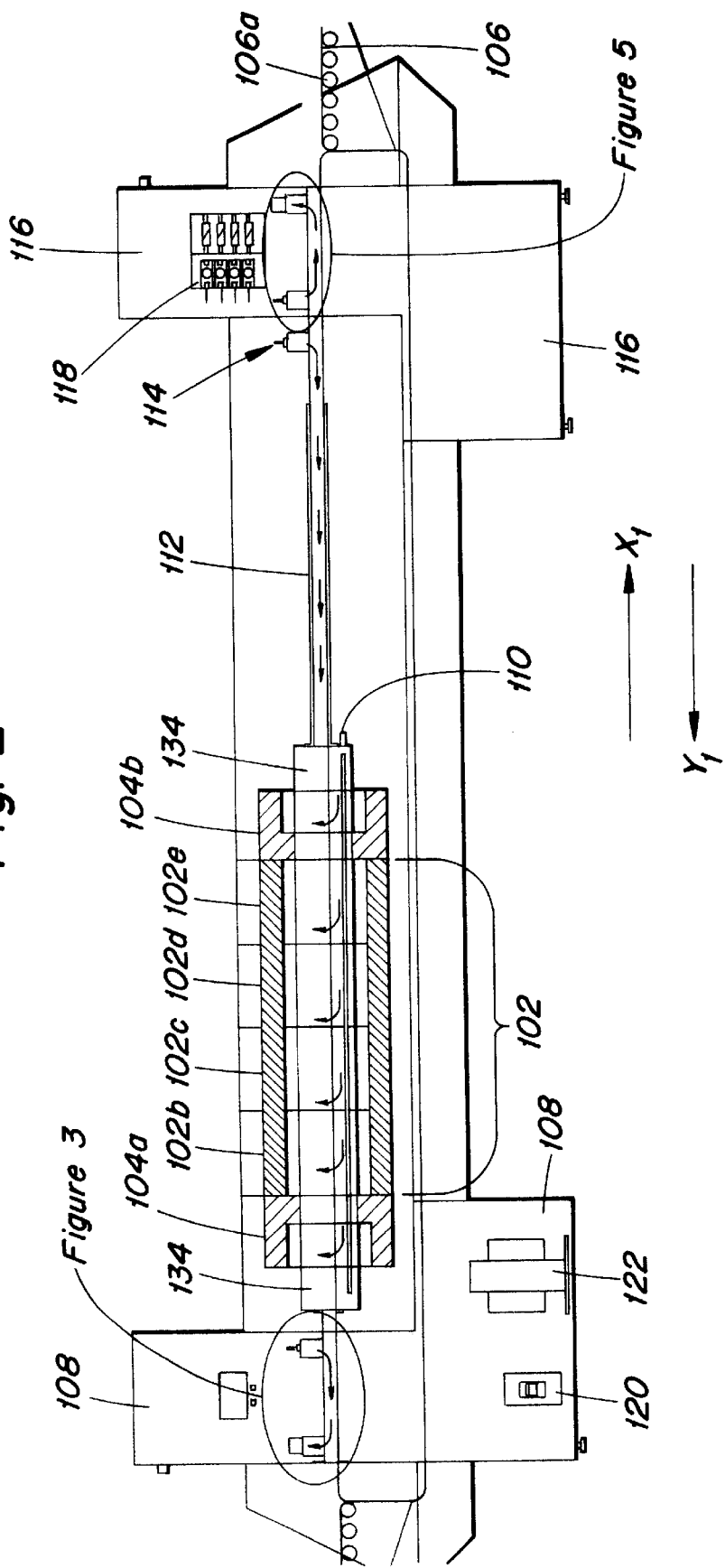
FIG. 2 illustrates a schematic view of a furnace in accordance with an embodiment of the present invention.

Now making reference to the Figures, and more particularly to FIG. 2 which illustrates a schematic view of a furnace 100 in accordance with an embodiment of the present invention. The furnace 100 heat treats a substrate 132 (shown with reference to FIG. 3) during a heat treatment process for the substrate 132. The substrate may include metal structures, semiconductor wafers or other materials and apparatus requiring heat treatment. These heat treatment processes may include any number of heat treatments necessary for the substrate, these heat treatments include but are not limited to, thermal curing for use in the semiconductor arts, the annealing of metals or the like. In accordance with an embodiment of the present invention, the furnace 100 may be constructed of materials rated up to 1400 degrees Celsius. The furnace 100 includes an end support structure 108, a heating zone 102, a cooling zone 112, and an end support structure 116. In addition to the end support structure 116, the furnace 100 also includes a transport mechanism 106 having individual rollers 106a. The transport mechanism 106 may be any apparatus suitable for advancing the substrate 132 through the furnace 100, apparatus which may be used include, but are not limited to, a belt assembly (i.e., metal belt, ceramic belt), a walking beam assembly or the like. The transport mechanism 106 allows for movement of the substrate 132 through the furnace 100 via the rollers 106a. As those skilled in the art will appreciate, the transport mechanism 106 includes various components (i.e., gears, sprockets, motors, etc.) necessary for moving the substrate 132 through the furnace 100. As may be seen with reference to FIG. 2, during heat treatment of the substrate 132 with the furnace 100, a portion of the transport mechanism 106 resides within the heating section 102. As defined herein a mass of the portion of the transport mechanism 106 residing within the heating section 102 during heat treatment of the substrate 132 and the operation of the furnace 100 contributes to a working mass of the furnace 100.

The end support structure 108 provides an enclosure for components necessary for the functionality of the furnace 100, such as a circuit breaker 120 and a transformer 122. The end support structure 108 also encloses circuitry to control the heating zones 102a through 102e during operation of the furnace 100. Moreover, the end support structure 108 includes an entry curtain section assembly 109 which provides a transition area between an environment external to the furnace 100 and an environment within the heating zone 102 using gas injectors 124 and 126, as more clearly shown with reference to FIG. 3.

Figure 3:
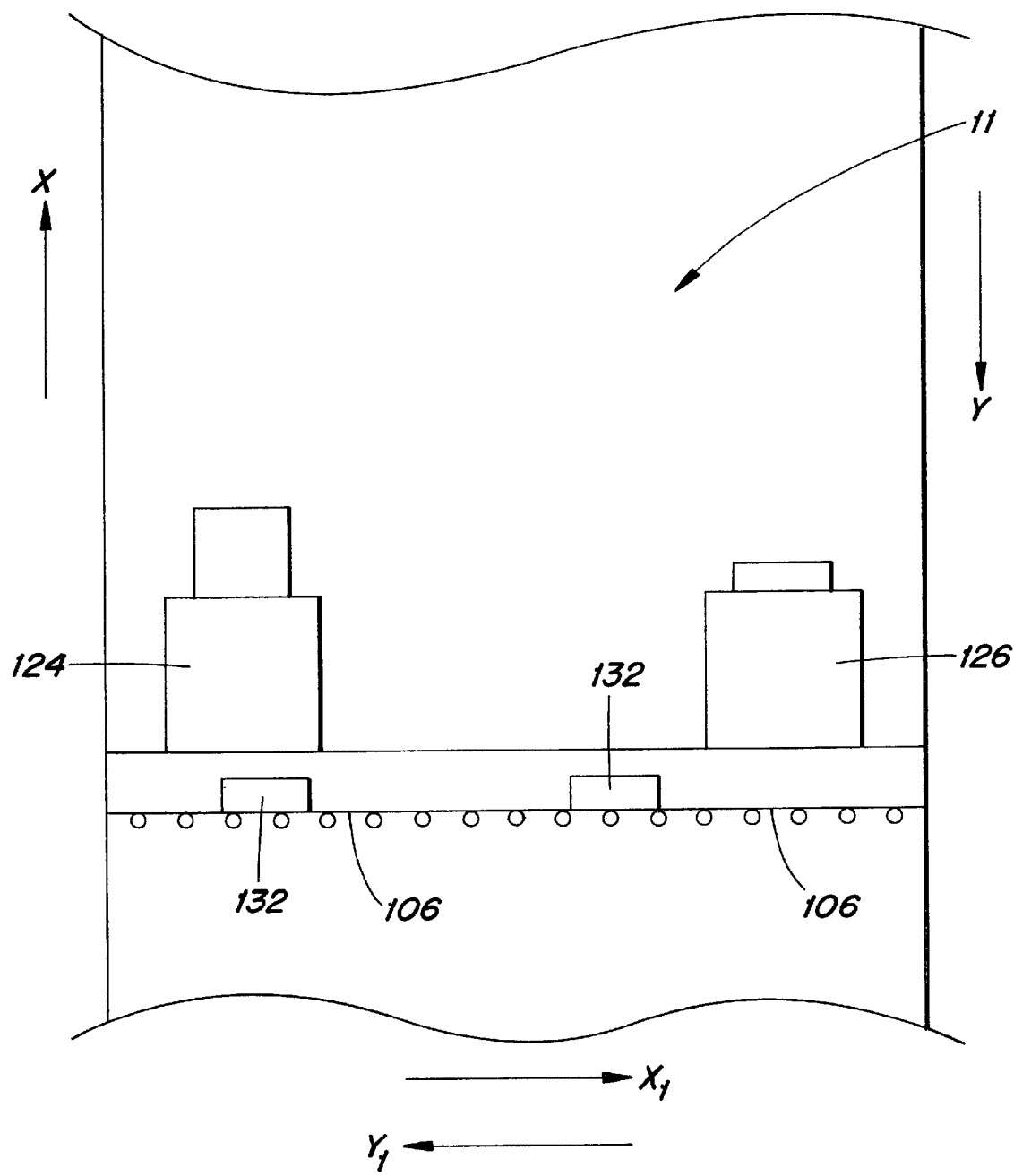
FIG. 3 is an embodiment of the present invention showing a schematic view of an entry curtain section assembly shown with respect to FIG. 2.

FIG. 3 is an embodiment of the present invention showing a schematic view of the entry curtain section assembly 109 shown with respect to FIG. 2. The entry curtain section assembly 109 includes the gas injectors 124 and 126 which allow for admittance and ejection of gas into and out of the entry curtain section assembly 109 during operation of the furnace 100. In this embodiment of the present invention, the gas injector 126 admits gas into the entry curtain section assembly 109 in a direction Y, as indicated by a directional arrow Y. The gas injector 124 ejects gas from the entry curtain section assembly 109 in a direction X, as indicated by directional arrow X. Therefore, the gas injectors 124 and 126 allow for the passage of gas through the entry curtain section assembly 109 in a direction $Y_1$, as indicated by a directional arrow $Y_1$. It should be noted that in an alternative embodiment of the present invention, the functionality of the gas injectors 124 and 126 may be reversed. As such, the gas injector 124 injects gas into the entry curtain assembly 109 in the direction Y and the gas injector 126 ejects gas from the entry curtain section assembly 109 in the direction X. Thus, in this embodiment, the flow of gas from the gas injectors 124 and 126 would be in a direction $X_1$, as indicated by a directional arrow $X_1$. In one embodiment of the present invention, the gas injected and ejected by the gas injectors 124 and 126 may be an inert gas, such as nitrogen gas ($N_2$).

As may be appreciated, the end support structure 108 has a mass which contributes to the overall mass of the furnace 100. The mass of the end support structure 108 includes components necessary for the functionality for the entry curtain section assembly 109. These components include apparatus (i.e., pipes, lines, hoses, etc.) which provide gas to the injectors 124 and 126, electronics necessary to control the entry curtain section assembly 109 and components within the end support structure 108 and the like. In addition to the end support structure 108, the furnace 100 also includes an entrance vestibule 104a disposed intermediate the end support structure 108 and the heating section 102 as shown with reference to FIG. 2. As may be seen with reference to the Figure, a processing chamber 134 extends from the heating section 102 through the entrance vestibule 104a and couples with both the end support structure 108 and the entry curtain section assembly 109. In addition, the processing chamber 134 extends from the heating section 102 through an exit vestibule 104b to the cooling zone 112, also as shown with reference to FIG. 2.

Figure 4:
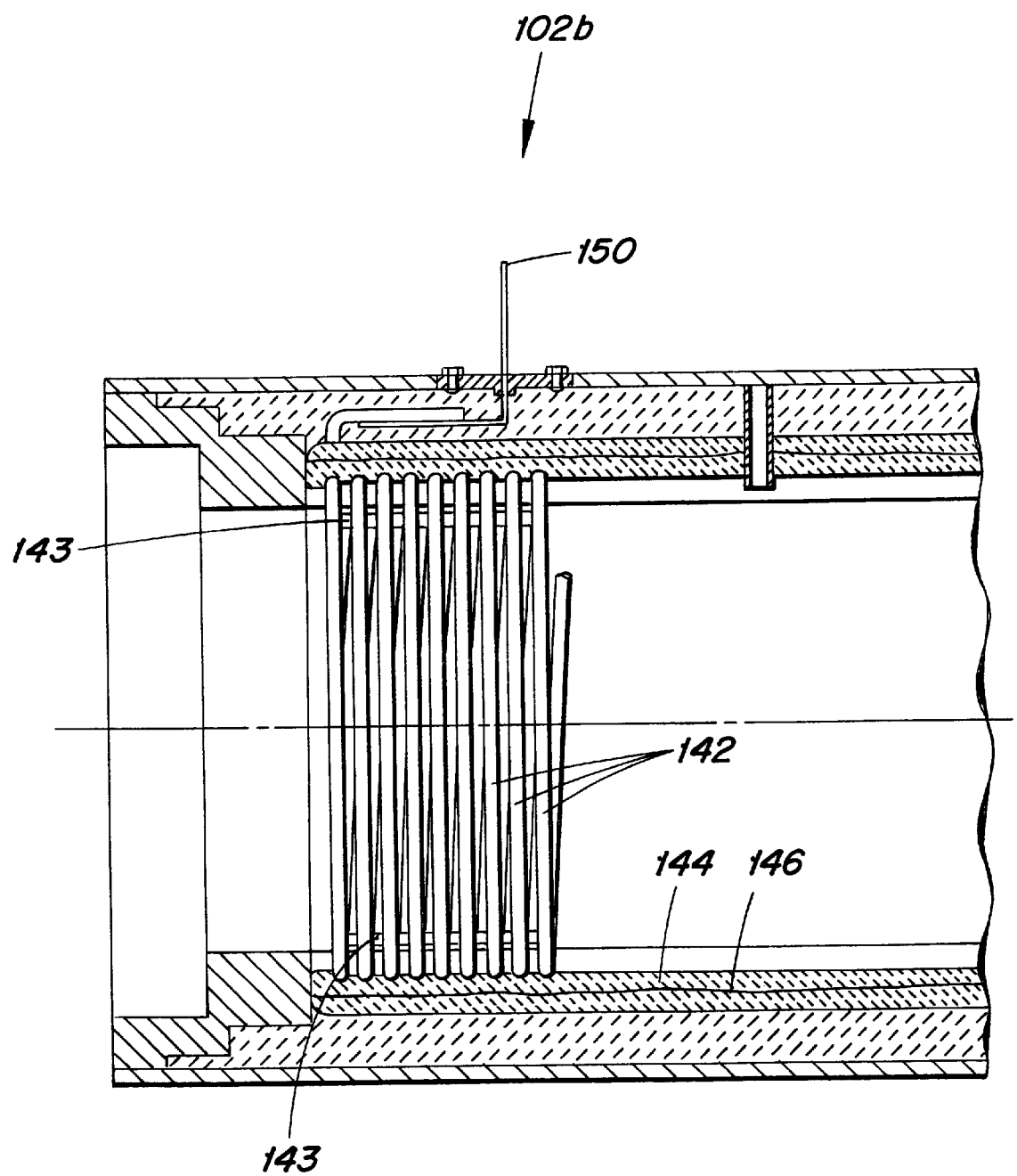
FIG. 4 is an embodiment of the present invention illustrating a schematic view of an individual heating zone.

The heating zone 102 includes individual heating zones 102b through 102e. The individual heating zones 102b through 102e are configured to heat treat the substrate 132 as it passes through the furnace 100, as more clearly shown with reference to FIG. 4. FIG. 4 is an embodiment of the present invention illustrating a schematic view of an individual heating zone 102b. It is to be understood that the individual heating zones 102b through 102e have the same configuration as that shown with reference to FIG. 4. As more fully described with reference to U.S. Pat. No. 5,038, 019, the disclosure of which is herein incorporated by reference in its entirety, the individual heating zone 102b includes heating coils 142, spacers 143, a first layer 144, a thin layer of insulation 146 and a contact 150. It should be noted that the individual heating zone 102b includes an additional contact 150 not shown. During operation of the furnace 100, power is fed through the contacts 150 thereby resistively heating the heating coils 142. The heating coils 142 are heated to individual temperatures within each of the individual heating zones 102b through 102e depending upon the desired heat treatment for the substrate 132 passing through the furnace 100. To further illustrate, the heating coils 142 within the individual heating zone 102b may operate at 400° Celsius while the individual heating zones 102c and 102e operate at 500° Celsius and the individual heating zone 102d operates 700° Celsius. Therefore, as may be appreciated, the individual heating zones 102b through 102e may operate at various temperatures thereby providing different heat treatments for the substrate 132 as the substrate 132 passes through the furnace 100.

A surface area of the heating coils is significantly large relative to the substrate 132 passing through the furnace 100. Therefore, the thermal requirements for the substrate 132 passing through the furnace 100 during operation of the furnace 100 are relatively small in comparison to the heating coil 142. Heat losses experienced by the heating coils 142 during heat treatment of the substrate are minimized. The minimal heat loss experienced by the heating coils minimizes the overall work exerted by the furnace 100 during heat treatment. Moreover, the minimal thermal fluctuations increase the overall life cycle of the heating coils 142 and the individual heating zones 102b through 102e along with the furnace 100. The overall life cycle of the furnace 100 also increases since the work required by the heating coils 142 to heat treat the substrate is small. Therefore, the furnace 100 minimizes costs associated with operating the furnace 100. To further illustrate, the energy requirements of the furnace 100 remains constant during heat treatment operations, thereby reducing overall operational costs associated with the furnace 100.

The circular configuration of the heating zone 102b further reduces overall operational costs associated with the furnace 100. As may be seen with reference to the Figure, the heating zone 102b has a cylindrical configuration which allows for even heat dissipation during heat treatment of the substrate 132. As discussed earlier, prior art furnaces included a rectangular configuration where different areas within the furnace were at different temperatures. The cylindrical configuration of the heating zone 102b obviates the previously described problems, thereby improving both overall efficiency of the furnace 100 and heat treatment of the substrate 132.

Making reference once again to FIG. 2 and the furnace 100, the furnace 100 also includes the exit vestibule 104b through which the processing chamber 134 extends. The processing chamber 134 extends through the exit vestibule 104b and couples the heating section 102 with cooling section 112, as shown with respect to FIG. 2. The cooling section 112 cools the substrate 132 after the substrate 132 passes through the heating zone 102. The cooling section 112 cools the substrate such that upon exit of the substrate 132 from the furnace 100, the substrate 132 is not materially affected from the change in temperature between the environment of the furnace 100 and an environment external to the furnace 100. Likewise, the cooling section 112 also cools the substrate 132 such that the substrate 132 may be handled by an end user upon exit from the furnace 100. In an embodiment of the present invention, the cooling section 112 may use a reverse flow heat exchange wherein a cooling medium, such as water, travels in the direction Y, as the substrate 132 travels in the direction $X_1$. A cooling medium feeds into the cooling section 112 via an injector 114. The cooling section 112 includes a mass which contributes to the overall mass of the furnace 100. Moreover, in accordance with an alternative embodiment of the present invention, cooling medium may also be fed such that the cooling medium travels in the direction $X_1$ along with the substrate 132.

In addition to the cooling section 112, an injector 110 is disposed adjacent the exit vestibule 104b, as shown with reference to FIG. 2. The injector 110 allows admittance of a gas into the heating zone 102 via the exit vestibule 104b. Examples of gasses which may be injected into the heating zone 102 via the injector 110 include nitrogen ($N_2$) and oxygen ($O_2$). In an embodiment of the present invention, nitrogen gas may be injected into the heating zone 102 via the injector 110 in order to purge the environment within the heating zone 102 of oxygen. This would be necessary in an embodiment where the furnace 100 is being used to anneal a metal in order to prevent oxidation and discoloration of the substrate upon exit from the furnace 100. In addition, the injector 110 may also inject either oxygen or air in order to burn off a binder placed on the substrate 132 during previous processing. Moreover, hydrogen ($H_2$) may also be injected via the injector 110 into the heating zone 102 in order to treat the environment within the heating zone 102.

The furnace 100 also includes an end support structure 116 adjacent the cooling section 112 which houses an exit curtain section assembly 117 and electronics necessary to control both the end support structure 116 and the exit curtain section assembly 117. The end support structure also includes a gas system 118 which relays process gases within the furnace 100. To further illustrate, the gas system 118 adjusts flow of process gases within the furnace 100 and adjusts flow of gases entering the furnace 100. In addition, the end support structure 116 includes the exit curtain section assembly 117 which provides a transition area for the controlled environment within the furnace 100 and an environment external to the furnace 100, as discussed with reference to FIG. 3 and the entry curtain section assembly 109. In order to provide a transition area between the environment and the furnace 100 and the environment external to the furnace 100, the exit curtain section assembly 117 includes gas injectors 128 and 130, as more clearly shown with reference to FIG. 5.

Figure 5:
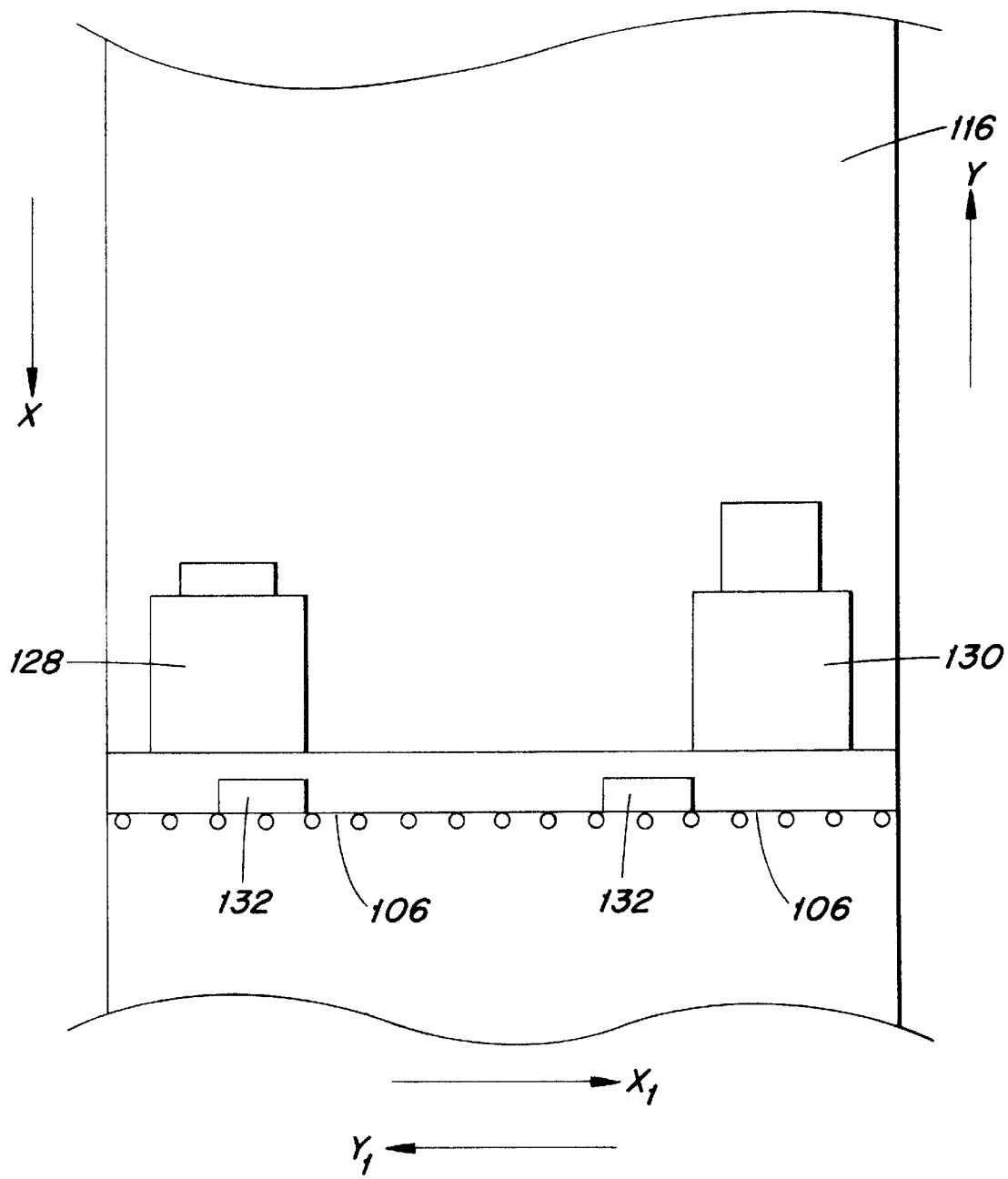
FIG. 5 is an embodiment of the present invention illustrating a schematic view of an exit curtain section assembly shown with respect to FIG. 2.

FIG. 5 is an embodiment of the present invention illustrating a schematic view of the exit curtain section assembly 117 shown with respect to FIG. 2. The gas injector 128 injects a gas into the exit curtain section assembly 117 in the direction X and the gas injector 130 ejects the gas in the direction Y. As such, gas travels within the exit curtain assembly section assembly 117 in a direction $X_1$. However, it should be noted that the gas injector 130 may inject gas in the direction X into the exit curtain assembly 117 while the gas injector 128 ejects gas from the exit curtain section assembly 117 in the direction Y. In this embodiment, the gas traveling within the exit curtain section assembly 117 travels in the direction $Y_1$. As discussed with reference to the entrance curtain section assembly 109 in FIG. 3, a gas which may be used within the exit curtain section assembly 117 in order to provide the transition area includes nitrogen ($N_2$) or any other suitable inert gas.

In addition, as discussed with reference to FIG. 3, the end support structure 116 includes a mass which contributes to the overall mass of the furnace 100. The mass of the end support structure 116 includes components necessary for the functionality of the end support structure 116 and the exit curtain section assembly 117. These components include apparatus (i.e., pipes, lines, hoses, etc.) which provide gas to the injectors 128 and 130, electronics necessary to control both the end support structure 116 and the entry curtain section assembly 117 and the like.

Figure 6:
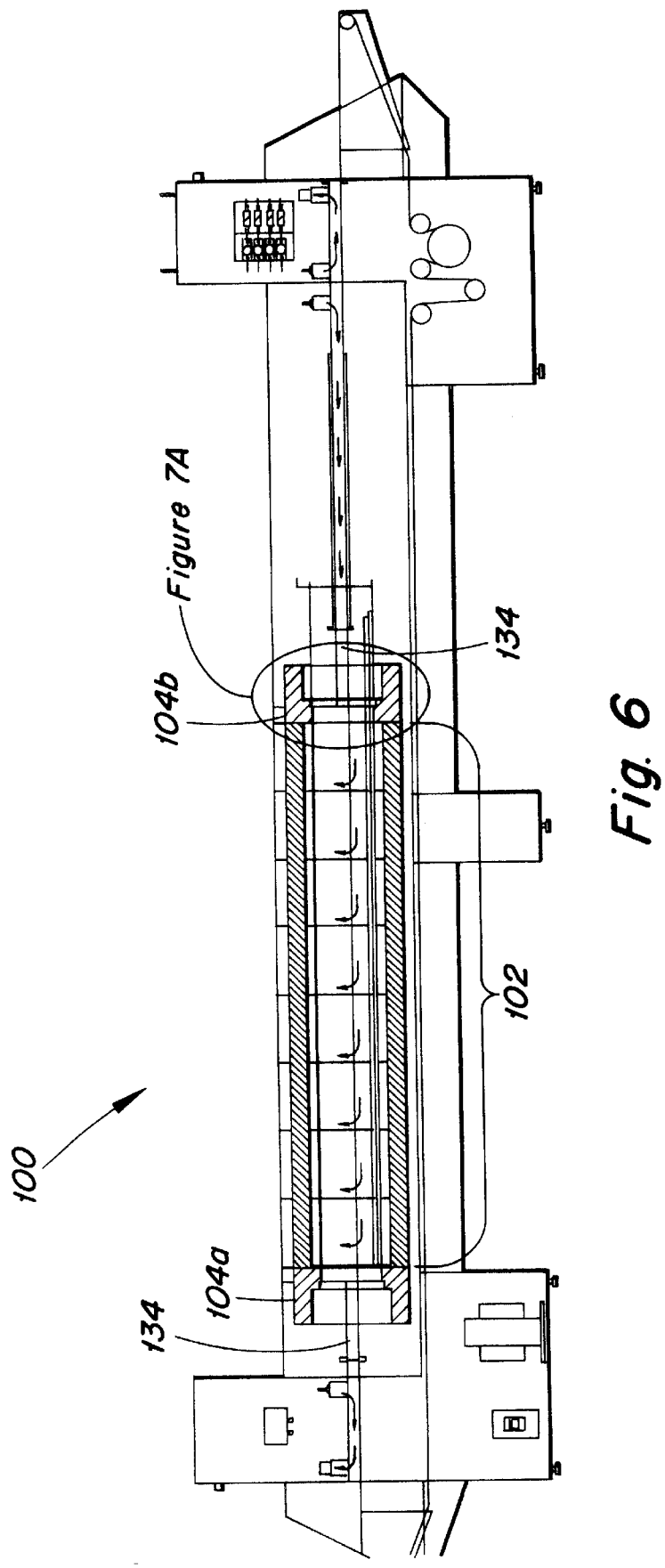
FIG. 6 is a schematic view illustrating an alternative embodiment of the furnace shown with respect to FIG. 2.

In addition to the embodiment shown with reference to FIG. 2, the furnace 100 may also have the configuration shown with reference to FIG. 6. As discussed with respect to FIG. 2, the processing chamber 134 couples with the entry curtain section assembly 109 and the processing chamber 134 couples with the cooling zone 112. In this embodiment, the processing chamber 134 extends through the both the entrance and exit vestibules 104a and 104b and couples the heating section 102 with both the entry curtain section assembly 109 and the cooling section 112 via a transition section 134a, as more clearly shown with reference to FIG. 7A.

FIG. 7A is a perspective view of an exit assembly for the heating zone 102 of the furnace 100 shown with reference to FIG. 2 in accordance with an embodiment of the present invention. The exit assembly includes lines 137a through 137c, the transition section 134a and end blocks 136a and 136b. The exit assembly also includes a soft collar 138 and radiation shields 140a and 140b. The lines 137a through 137c allow admittance of working gases into the heating zone 102 during operation of the furnace 100, as will be discussed in much greater detail with reference to FIG. 2 and the injector 110. The lines 137a through 137c also allow passage of an in-situ thermocouple into the heating zone 102 which allows continuous monitoring of the temperature of the heating zone 102 during operation of the furnace 100.

The processing chamber 134 allows passage of the substrate 132 through the heating section 102 during heat treatment of the substrate 132. The transport mechanism 106 and the substrate 132 pass through the processing chamber 134 during heat treatment of the substrate 132. In accordance with an embodiment of the present invention, the processing chamber 134 and the transition section 134a are configured such that minimal space exists between the substrate 132 and the processing chamber 134, as more clearly shown with reference to FIG. 7C.

Figure 7C:
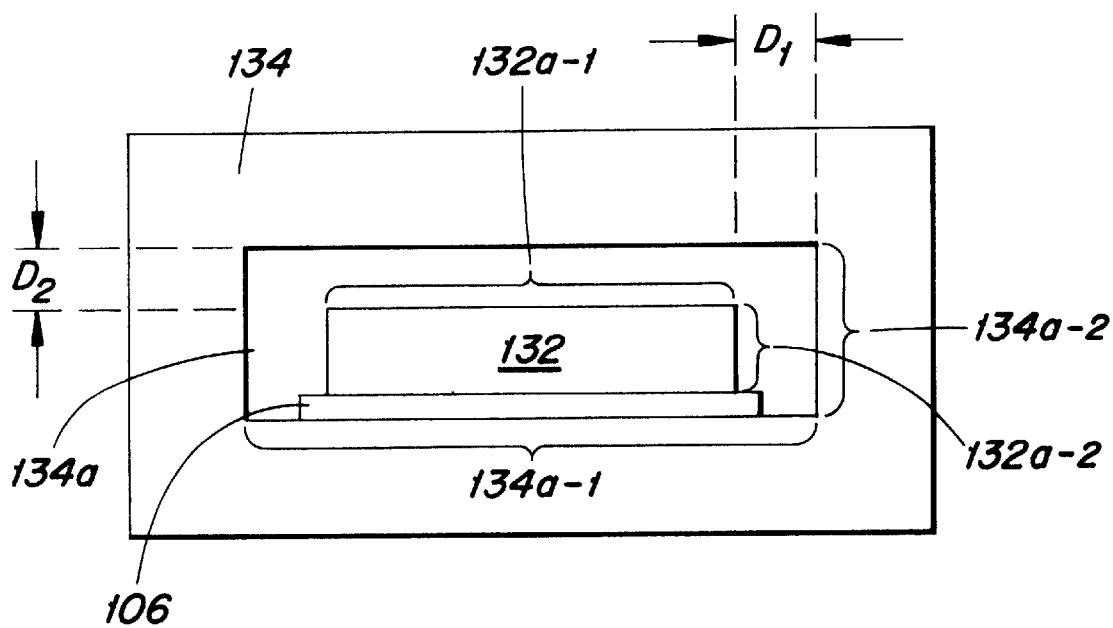
FIG. 7C shows a schematic front view of a heating chamber shown with reference to FIG. 7A in accordance with an embodiment of the present invention.

FIG. 7C shows a schematic front view of the transition section 134a shown with reference to FIG. 7A in accordance with an embodiment of the present invention. As may be seen with reference to the Figure, the transition section 134a includes a passage 134a' having dimensions 134a-1 and 134a-2 which correspond to dimensions 132a-1 and 132a-2 of the substrate 132. In an exemplary embodiment of the present invention, the dimensions 134a-1 and 134a-2 of the transition section 134a are sized according to the dimensions 132a-1 and 132a-2 of the substrate in order to minimize the amount of thermal loss from the processing chamber 134 during operation of the furnace 100. The dimensions 134a-1 and 134b-1 of the processing chamber 134 are sized in order to minimize dimensions $D_1$ and $D_2$ as shown with reference to the Figure. For example, if the dimension 132a-1 of the substrate 132 is about 10 cm, then the dimension 134a-1 of the processing chamber is preferably about 15 cm in order to accommodate the substrate 132. In addition, in this example, if the dimension 132a-2 of the substrate is approximately 3 cm, then the dimension 134a-2 of the processing chamber will be about 5 cm in this example in order to facilitate passage of the substrate 132 through the processing chamber 134. It should be noted that the provided dimensions are for explanatory purposes and any combination of dimensions may be used depending on a substrate to be heat treated within a furnace of the present invention.

Returning attention to FIG. 7A and the processing chamber 134 shown with respect to FIG. 7A, the transition section 134a resides within the end blocks 136a and 136b. The end blocks 136a and 136b provide thermal insulation for the heating section 102, thereby minimizing heat loss from the heating section 102 during operation of the furnace 100. In addition, the end blocks 136a and 136b support the processing chamber 134 within the heating section 102. In one embodiment of the present invention, the end blocks 136a and 136b may be constructed from any material capable of thermally isolating the heating section 102 from an environment external to the heating zone 102, such as molded ceramic fiber or the like. The end blocks 136a and 136b also provide an interface between either the individual heating zones 102b and 102e and the soft collar 138.

The soft collar 138 resides against the end blocks 136a and 136b thereby enclosing the heating section 102 and the processing chamber 134. The soft collar 138 provides a seal between the radiation shields 140a and 140b and the end blocks 136a and 136b. In addition, the soft collar 138 also provide thermal insulation for the heating section 102. In an embodiment of the present invention, the soft collar 138 may be constructed of any material which provides sealing capability and thermal isolation, such as soft ceramic or the like. In addition, the radiation shields 140a and 140b reside against the soft collar 138, as more clearly shown with reference to FIG. 7B. The radiation shields 140a and 140b provide further thermal insulation of the heating section 102, thereby minimizing thermal losses from the heating section 102 and the furnace 100. In an embodiment of the present invention, the radiation shields 140a and 140b may be constructed of any material which allows for thermal insulation between the heating section 102 and the an environment external to the heating zone 120 (e.g., the cooling zone 112, the entry curtain section assembly 109, etc.), such as stainless steel or the like.

The transition section 134a exits the processing chamber 134 as shown with respect to the Figure. In this embodiment, the transition section 134a couples the heating section 102 with the cooling zone 112. It should be noted that in exemplary embodiment of the present invention, the processing chamber 134 includes a second transition section (not shown) similar to the transition section 134a. In this embodiment, the second transition section couples with the processing chamber 134, thereby entering the heating section 102 via the heating zone 102b in the same manner to form an entrance assembly. Likewise, in this embodiment, the second transition section couples the heating section 102 with the entry curtain section assembly 109. The transition section 134a has a cross sectional area smaller than a cross sectional area of the processing chamber 134. Therefore, the transition section 134a reduces the cross sectional area of the processing chamber 134 as the processing chamber 134 extends from the heating section 102 and couples with both the entry curtain section assembly 109 and the cooling zone 112.

In an exemplary embodiment of the present invention, a mass of the heating section exceeds a mass of the working components within the heating section. The heating section mass includes the mass of the heating coils 142 disposed within the heating zones 102b through 102e and the spacers 143 of the heating coils 142. The working component mass includes the mass of components within the heating section during heat treatment of the substrate 132. These components include a portion of the transport mechanism 106 within the heating section 102, as more clearly shown with reference to FIG. 2, any number of substrates within the heating section during a heat treatment operation, and a portion of the processing chamber 134 within the heating section 102. The greater mass of the heating section relative to the working components within the heating section increases overall efficiency of the furnace 100. In addition, the greater mass of the heating section 102 relative to the working components minimizes thermal fluctuations experienced by the furnace 100 during heat treatment operations, thereby increasing efficiency of the furnace 100 and decreasing operational costs associated the furnace 100.

Therefore, the present invention provides an attractive alternative to heat treatment of substrates. As previously discussed, a furnace employs a heating section having a high mass relative to the working components of the furnace and a substrate being heat treated. The thermal losses felt by the heating coils within the heating zones and within the heating zones themselves are relatively small. As such, the thermal work required of the heating zones and the furnace is comparatively small, thereby increasing the life cycle of the furnace. In addition, the energy needs of the furnace are small since the furnace requires a steady stream of energy. To further illustrate, as substrates are heat treated, the furnace accounts for minimal loss in thermal energy due to heat treating of the substrate. Since the furnace does not have to account for great thermal fluctuations during operation, the furnace requires minimal additional energy during heat treatment of substrates.

The above are exemplary modes of carrying out the invention and are not intended to be limiting. It will be apparent to those of ordinary skill in the art that modifications thereto can be made without departure from the spirit and scope of the invention as set forth in the accompanying claims.

What is claimed is:

1. A furnace for heat treating a substrate, the furnace comprising:
   a heating section for heat treating the substrate as the substrate passes through the furnace, the heating section including heating coils having spacers, the spacers being disposed within individual coils of the heating coils, the heating coils providing heat to the heating section, the heating section having a mass, the mass being defined by a mass of the heating coils and a mass of the spacers;
   a transport mechanism having a mass, the transport mechanism being disposed within the heating section, the transport mechanism transporting the substrate through the heating section; and
   a processing chamber having a mass, the processing chamber being disposed within the heating section wherein the heating section mass exceeds a combined mass of the transport mechanism mass, the processing chamber mass and a mass of the substrate within the heating section.

2. A furnace for heat treating a substrate as recited in claim 1, the heating section further comprising:
   a plurality of heating zones wherein the heating coils reside within the plurality of the heating zones such that individual heating zones of the plurality of heating zones have different temperatures for providing different heat treatments to the substrate.

3. A furnace for heat treating a substrate as recited in claim 2, the heating section further comprising:
   an in-situ thermocouple disposed within the heating section.

4. A furnace for heat treating a substrate as recited in claim 1, wherein the heating section has a cylindrical configuration.

5. A furnace for heat treating a substrate as recited in claim 1, wherein the transport mechanism is a walking beam assembly.

6. A furnace for heat treating a substrate as recited in claim 1, wherein the transport mechanism is a belt.

7. A furnace for heat treating a substrate as recited in claim 3, wherein the heating section is constructed with materials rated for 1400 degrees Celsius.

8. A furnace for heat treating a substrate as recited in claim 1, the furnace further comprising:
an entry curtain section assembly for admittance of the substrate into the furnace, the entry curtain section assembly disposed adjacent the heating section where the entry curtain section assembly includes a plurality of injectors which maintain a transition area for the substrate as the substrate enters the furnace.

9. A furnace for heat treating a substrate as recited in claim 8, the furnace further comprising:
a cooling zone disposed adjacent the heating section opposite the entry curtain section assembly, the cooling zone having a reverse flow heat exchanger for cooling the substrate upon exit of the substrate from the heating section.

10. A furnace for heat treating a substrate as recited in claim 9, the furnace further comprising:
an exit curtain assembly which allows exit of the substrate from the furnace, the exit curtain section assembly disposed adjacent the cooling zone where the exit curtain section assembly includes a plurality of injectors which maintain a transition area for the substrate as the substrate exits the furnace.

11. A furnace for heat treating a substrate as recited in claim 10, the processing chamber further comprising:
a first transition section having a cross sectional area smaller than a cross sectional area of the processing chamber, the first transition section being disposed at a first end of the processing chamber thereby coupling the processing chamber with the entry curtain section assembly; and
a second transition section having a cross sectional area smaller than the processing chamber cross sectional area, the second transition section being disposed at a second end of the processing chamber opposite the first transition section thereby coupling the processing chamber with the cooling zone.

12. A furnace for heat treating a substrate having a mass, the furnace comprising:
a heating section, the heating section including:
a plurality of heating coils having spacers, the spacers being disposed within individual coils of the heating coils wherein a mass of the plurality of heating coils and a mass of the spacers contributes to a heating section mass;
working components having a working component mass, the working components including:
a transport mechanism disposed within the furnace where a mass of the transport mechanism disposed within the heating section contributes to the working component mass; and
a processing chamber disposed within the furnace such that a mass of the processing chamber disposed within the heating section contributes to the working component mass wherein the heating section mass exceeds a combined mass of a substrate disposed within the heating section and the working component mass.

13. A furnace for heat treating a substrate as recited in claim 12, the furnace further comprising:
an entry curtain section assembly for admittance of the substrate into the furnace, the entry curtain section assembly disposed adjacent the heating section where the entry curtain section assembly includes a plurality of injectors which maintain a transition area for the substrate as the substrate enters the furnace.

14. A furnace for heat treating a substrate as recited in claim 13, the furnace further comprising:
a cooling zone disposed adjacent the heating section, the cooling zone having a reverse flow heat exchanger for cooling the substrate upon exit from the heating section.

15. A furnace for heat treating a substrate as recited in claim 14, the furnace further comprising:
an exit curtain assembly which allows exit of the substrate from the furnace, the exit curtain section assembly disposed adjacent the cooling zone where the exit curtain section assembly includes a plurality of injectors which maintain a transition area for the substrate as the substrate exits the furnace.

16. A furnace for heat treating a substrate as recited in claim 12, wherein the transport mechanism is a belt.

17. A furnace for heat treating a substrate as recited in claim 12, wherein the transport mechanism is a walking beam assembly.

18. A furnace for heat treating a substrate as recited in claim 12, the furnace further comprising:
an in-situ thermocouple disposed within the heating section.

19. A furnace for heat treating a substrate as recited in claim 14, the processing chamber further comprising:
a first transition section having a cross sectional area smaller than a cross sectional area of the processing chamber, the first transition section being disposed at a first end of the processing chamber thereby coupling the processing chamber with the entry curtain section assembly; and
a second transition section having a cross sectional area smaller than the processing chamber cross sectional area, the second transition section being disposed at a second end of the processing chamber opposite the first transition section thereby coupling the processing chamber with the cooling zone.

20. A furnace for heat treating a substrate, the furnace comprising:
an entry curtain section assembly for admittance of the substrate into the furnace;
a heating section coupled with the entry curtain section assembly for heat treating the substrate as the substrate passes through the furnace, the heating section including heating coils for providing heat to the heating section and spacers disposed within the heating coils, the spacers being disposed within individual coils of the heating coils, the heating section having a mass;
a transport mechanism having a mass disposed within the heating section, the transport mechanism transporting the substrate through the heating section;
a cooling zone coupled with the heating section, the cooling zone having a reverse flow heat exchanger for cooling the substrate as the substrate passes through the cooling zone;
an exit curtain section assembly for facilitating exit of the substrate from the furnace upon cooling of the substrate; and a processing chamber, the processing chamber extending through the heating section and coupling the heating section with both the entry curtain section assembly and the cooling zone wherein the heating section mass exceeds a combined mass of a portion of the processing chamber within the heating section, the transport mechanism mass and a mass of a substrate within the heating section.

21. A furnace for heat treating a substrate as recited in claim 20, the processing chamber comprising:

a first transition section having a cross sectional area smaller than a cross sectional area of the processing chamber, the first transition section being disposed at a first end of the processing chamber thereby coupling the processing chamber with the entry curtain section assembly; and a second transition section having a cross sectional area smaller than the processing chamber cross sectional area, the second transition section being disposed at a second end of the processing chamber opposite the first transition section thereby coupling the processing chamber with the cooling zone.

22. A furnace for heat treating a substrate as recited in claim 20, wherein the transport mechanism is a walking beam assembly.

23. A furnace for heat treating a substrate as recited in claim 20, the furnace further comprising:

an in-situ thermocouple disposed within the heating section.

* * * * *